United States Patent
Koh et al.

(10) Patent No.: US 6,242,344 B1
(45) Date of Patent: Jun. 5, 2001

(54) TRI-LAYER RESIST METHOD FOR DUAL DAMASCENE PROCESS

(75) Inventors: Leong Tee Koh, Johor (MY); Marokkey Raphael Sajan, Singapore (SG); Tsun-Lung Alex Cheng, Singapore (SG); Joseph Zhifeng Xie, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/498,986

(22) Filed: Feb. 7, 2000

(51) Int. Cl.[7] .................................................. H01L 21/4763
(52) U.S. Cl. .......................... 438/638; 438/701; 438/713; 438/640; 438/978
(58) Field of Search ..................... 438/638, 636, 438/640, 713, 43, 701, 978

(56) References Cited

U.S. PATENT DOCUMENTS

| | | | |
|---|---|---|---|
| 5,635,423 | 6/1997 | Huang et al. | 437/195 |
| 5,686,354 | 11/1997 | Avanzino et al. | 437/190 |
| 5,741,626 | 4/1998 | Jain et al. | 430/314 |
| 5,801,094 | 9/1998 | Yew et al. | 438/624 |
| 5,863,835 | 1/1999 | Yoo et al. | 438/666 |
| 5,877,075 | 3/1999 | Dai et al. | 438/597 |
| 5,882,996 | 3/1999 | Dai | 438/597 |
| 5,904,565 | 5/1999 | Nguyen et al. | 438/687 |
| 5,906,910 | * 5/1999 | Nguyen et al. | 430/311 |
| 5,933,761 | 8/1999 | Lee | 438/783 |
| 5,935,762 | 10/1999 | Dai et al. | 430/312 |

* cited by examiner

Primary Examiner—Chandra Chaudhari
Assistant Examiner—Thanh Nguyen
(74) Attorney, Agent, or Firm—George O. Saile; Stephen B. Ackerman (57) ABSTRACT

Under the first embodiment of the invention, a three layer composite layer of insulation is deposited. The trench is etched into this composite layer of insulation followed by a hard bake. The via etch is performed, completing the formation of the dual damascene profile. The created dual damascene profile is transferred into the underlying substrate; the layer of photoresist is removed. Under the second embodiment of the invention, a two layer composite layer of insulation is deposited over a semiconductor surface. The trench is etched into this composite layer of insulation. A layer of positive photoresist is deposited over the second layer of cross-linked negative resist and masked for the via etch. The via etch is performed, the created dual damascene profile is transferred into the underlying substrate. The removal of the layers of patterned photoresist completes the formation of the dual damascene structure.

28 Claims, 5 Drawing Sheets

FIG. 6f

TRI-LAYER RESIST METHOD FOR DUAL DAMASCENE PROCESS

BACKGROUND OF THE INVENTION

(1) Field of the Invention

The invention relates to the fabrication of integrated circuit devices, and more particularly, to a method of creating small geometry dual-damascene structures.

(2) Description of the Prior Art

In fabricating very and ultra large scale integration (VLSI and ULSI) circuits, one of the more important aspects of this fabrication is the fabrication of metal interconnect lines and vias that provide the interconnection of integrated circuits in semiconductor devices. The invention specifically addresses the fabrication of conductive lines and vias using the damascene process. Using the dual damascene process, an insulating layer or a dielectric layer, such as silicon oxide, is patterned with a multiplicity of openings for the conductive lines and vias. The openings are simultaneously filled with a metal, such as aluminum, and serve to interconnect the active and/or the passive elements of an integrated circuit. The dual damascene process is also used for forming multilevel conductive lines of metal, such as copper, in the insulating layers, such as polyimide, of multilayer substrates on which semiconductor devices are mounted. Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. Dual damascene is an improvement over single damascene because it permits the filling of both the conductive grooves and vias with metal at the same time, thereby eliminating processing steps. The dual damascene process requires two masking steps to form first the via pattern after which the pattern for the conductive lines is formed.

In the standard dual damascene process an insulating layer is deposited over the surface of a substrate and coated with a layer of photoresist, the photoresist is exposed through a via mask which contains an image pattern of the via openings. The via pattern is anisotropically etched in the upper half of the insulating layer. The photoresist now is exposed through an interconnect line pattern mask with an image pattern of conductive line openings. The second exposure of the interconnecting line patterns is aligned with the via mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. The metal is now polished back to form an inlaid planar dual damascene structure.

Critical to a good dual damascene structure is that the edges of the via openings in the lower half of the insulating layer are clearly defined. Furthermore, the alignment of the two masks is critical to assure that the pattern for the conductive lines aligns with the pattern of the vias. This requires a relatively large tolerance while the via may not extend over the full width of the conductive line.

Semiconductor device performance improvements are largely achieved by reducing device dimensions while increasing device-packaging densities. One of the major technologies that is used in the creation of semiconductor devices is photolithography. Photolithography is used to project images of device features that are contained in a reticle onto the surface where these images have to be created as device features. To obtain the required image quality and the subsequent high device yield, the images that are created in this manner must be precise and easy to repeat. This requirement of image precision brings with it that the light that is used to project the images is not deflected before reaching its target surface and not reflected upon reaching its target surface. Reflection of the projected light can occur if metal surfaces are underlying the target surface and if these metal surfaces readily reflect light. Unwanted reflections that are created by underlying layers of reflective materials are a prime source of distortion in the patterns that are created by photolithographic patterning.

To minimize the effect that reflected light has on image creation, Anti Reflective Coatings (ARC's) have been developed. These ARC's are frequently applied as a blanket deposition over the surface that caused light reflection such as a layer of metal. The coating of ARC however is an electrically conductive coating and can therefore only be applied where the application of this coating does not cause electrical short circuits between the layers over which the ARC is deposited. To prevent electrical short circuits from occurring, the ARC must be removed from between electrically conducting device features. This poses a problem for applications where dual damascene structures are being created. In the standard dual damascene process, an insulating layer is deposited over a semiconductor surface and coated with a layer of photoresist, the photoresist is exposed through a via mask with contains an image pattern of the via openings. The via pattern is anisotropically etched in the upper half of the insulating layer. The photoresist now is exposed through an interconnect line pattern mask with an image pattern of conductive line openings. The second exposure of the interconnecting line patterns is aligned with the via mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. The metal is now polished back to form an inlaid planar dual damascene structure. The metal that is used to fill the dual damascene structure is never etched meaning that no layer of ARC can be deposited over the dual damascene structures since this would cause massive electrical shorts between the dual damascene structures through the layer of ARC.

The solution to the problem of electrical shorts that are created through the deposited layer of ARC is to find materials that have ARC properties that however are not electrically conductive, such as a typical dielectric material. Some dielectric ARC's, such as silicon-rich silicon nitride or aluminum nitride, are known in the art. These dielectric ARC's however prove to be not suited for use as anti reflecting coatings because these materials exhibit the combination of ARC and insulating properties only at light frequencies in the Deep Ultra Violet (248 nm) wavelength range. For most of the photolithographic exposures that are applied in the creation of small geometry device-size features, such as I-line or G-line processing, these exposures are made in the higher wavelength (near ultra-violet or NUV with a wavelength of 365 nm) where the optimal ARC characteristics of these materials are not present.

In the formation of semiconductor metal lines and via or contact openings, the metal must be patterned. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (negative working) and form the pattern, or soluble (positive working) and be washed away. In either case, the remaining resist on the surface forms the desired pattern.

In the ideal world of creating semiconductor devices, such semiconductor fabrication aspects as layer depositions (for instance the deposition of a layer of photoresist where the resist sensitivity to photolithographic exposure is uniform over the surface of the deposited photoresist) and surface planarity would all be uniform. In the real world, small changes in the depth of the deposited layer of photoresist can lead to significant variations in the apparent depth of focus on a substrate. This problem becomes more acute with decreasing device feature size and in going from g-line to l-line to DUV processes. Non-planarity of deposited surfaces creates problems of uniform depositions where for instance deposited metal lines cross over steps in the underlying surface, the light that passes over non-vertical sidewalls of the steps causes energy dispersion that can for instance result in energy being concentrated in a non-homogeneous manner in regions that are adjacent to the steps. For these very small line technologies, even the grain structure of the underlying layer of for instance antireflective coatings can have an impact on photoresist resolution and on subsequent line uniformity and reliability. The solution to the indicated problems can be through either providing photoresist materials that negate the negative effects that have been highlighted or by providing antireflective coatings that are better suited to deep sub-micron processing applications. Dyed photoresist have been successfully applied but have a number of restrictions created by optical and chemical effects. Dye based photoresist is very sensitive to the dye loading of the resist causing extreme sensitivity to variations in exposure dosage and the geometric make-up of the surrounding surfaces such as sidewall angles and the like. Despite these disadvantages, dyed resists have been widely applied as a photoresist. Organic anti-reflective coatings (ARC's) may in general be formed from any of several organic polymer materials that incorporate dye chromophores that are tuned to a particular frequency of light whereby the light reflection is desired to be attenuated for this frequency. Such coating of ARC are typically formed on the surface of a semiconductor substrate through spin-coating of organic solvent solutions that contain the dye chromophore and the organic solvent material, as well as other solvents. This deposition is followed by a thermal evaporation of the solvent leaving the organic dye in place.

Accordingly, there is a need for an improved semiconductor manufacturing operation which provides the action of an anti-reflective coating and that is applicable to the more prevalent I-line or G-line processing and which can be used in applications, such as dual damascene, which require ARC's that are nonconductive and that are potentially used as a damascene etch stop layer. These improved methods and materials must be applicable to the formation of patterned layers of aperture width in the deep sub-micron range while employing near ultra-violet (NUV with a wavelength of 365 nm) photolithography exposure.

Figure 1A:
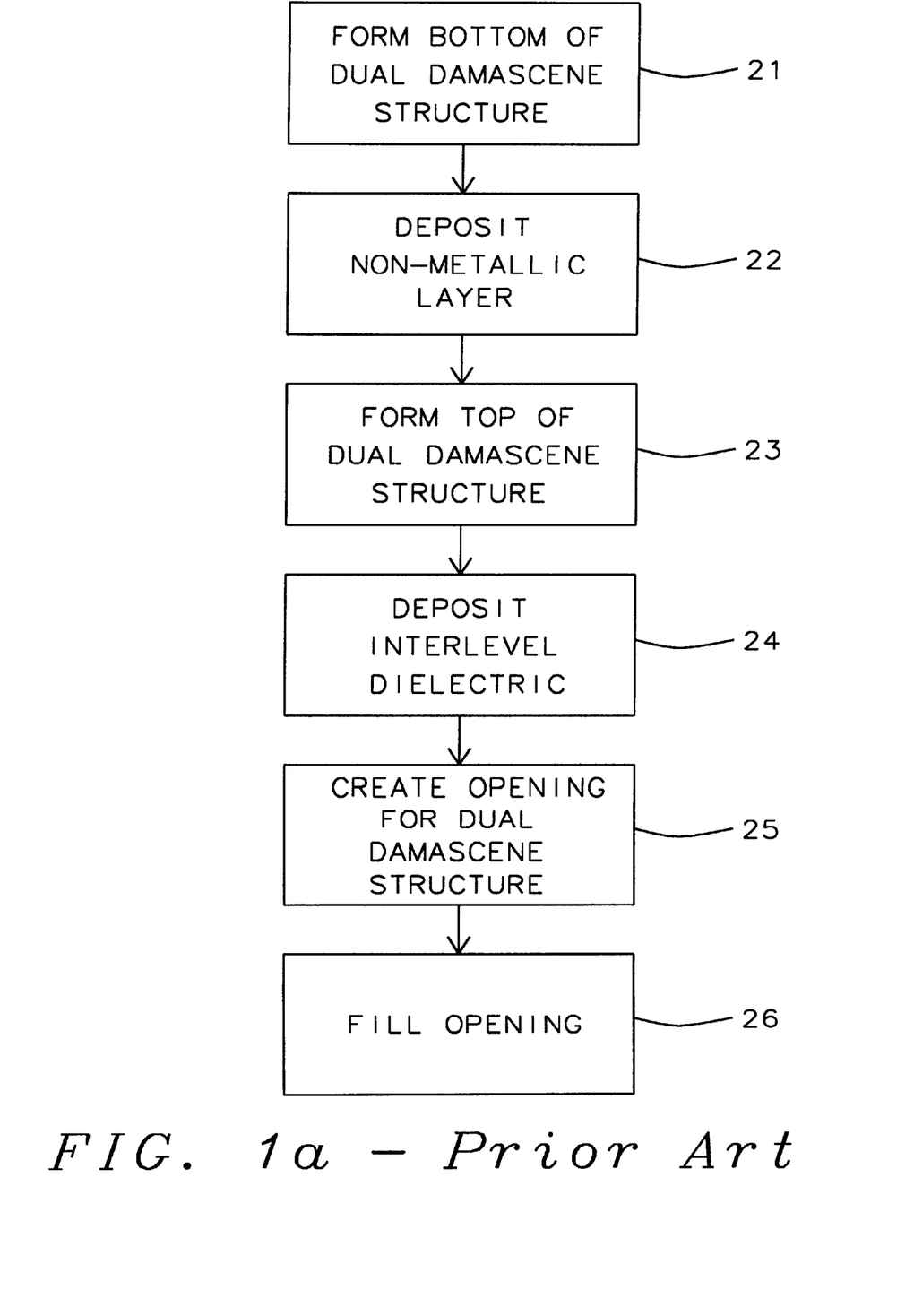
FIG. 1a shows a flow diagram of the processing steps that are required to form the dual damascene structure
Figure 1B:
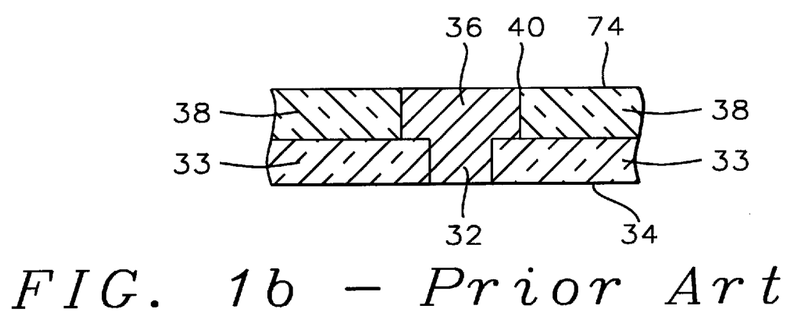
FIG. 1b shows a cross section of a dual damascene structure.

FIGS. 1a and 1b graphically illustrate the conventional process of the formation of a dual damascene structure.

FIG. 1a gives and overview of the sequence of steps required in forming a Prior Art dual damascene structure. The numbers referred to in the following description of the formation of the dual damascene structure relate to the cross section of the completed dual damascene structure that is shown in FIG. 1b.

FIG. 1a, 21 shows the creation of the bottom part of the dual damascene structure by forming a via pattern 32 on a surface 34, this surface 34 can be a semiconductor wafer but is not limited to such. The via pattern 32 is created in the plane of a dielectric layer 33 and forms the lower part of the dual Damascene structure. $SiO_2$ can be used as a dielectric for layer 33.

FIG. 1a, 22 shows the deposition within plane 30 (FIG. 1b) of a layer of non-metallic material such as poly-silicon on top of the first dielectric 33 and across the vias 32, filling the via openings 32.

FIG. 1a, 23 shows the formation of the top section 36 of the dual damascene structure by forming a pattern 36 within the plane of the non-metallic layer 30. This pattern 36 mates with the pattern of the previously formed vias 32 (FIG. 1a, step 21) but it will be noted that the cross section of the opening 36 within the plane 30 of the non-metallic layer is considerably larger than the cross section of the via opening 32. After pattern 36 has been created and as part of this pattern creation step, the remainder of the non-metallic layer 30 is removed, the pattern 36 remains at this time.

FIG. 1a, 24 shows the deposition and planarization (down to the top surface of pattern 36) of an inter level dielectric (ILD) 38, a poly-silicon can be used for this dielectric.

FIG. 1a, 25 shows the creation of an opening by removing the poly-silicon from the pattern 36 and the via 32. It is apparent that this opening now has the shape of a T and that the sidewalls of the opening are not straight but show a top section that is larger than the bottom section.

FIG. 1a, 26 shows the step of filling the created opening 32/36 of the dual damascene structure with metal after which the metal is removed using CMP from the surface of layer 38 (FIG. 1b).

FIG. 1b shows the cross section of the dual Damascene structure where a barrier 40 has been formed on the sides of the created opening. The opening, which has previously been created by removing the poly-silicon from the pattern 36 and the vias 32, has been filled with a metal. Metal such as Wolfram or copper can be used for this latter processing step. The narrow lower section 32 of the dual damascene structure is frequently referred to as the via or contact section while the wider upper section 36 is frequently referred to as the trench or interconnect line section.

Figure 2:
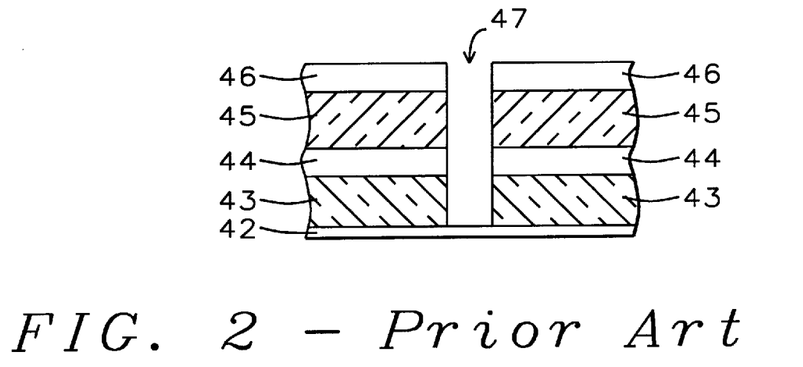
FIG. 2 shows the Prior Art deposition of successive layers of dielectric and stop layers in the creation of a dual damascene structure, a via opening has been etched.
Figure 3:
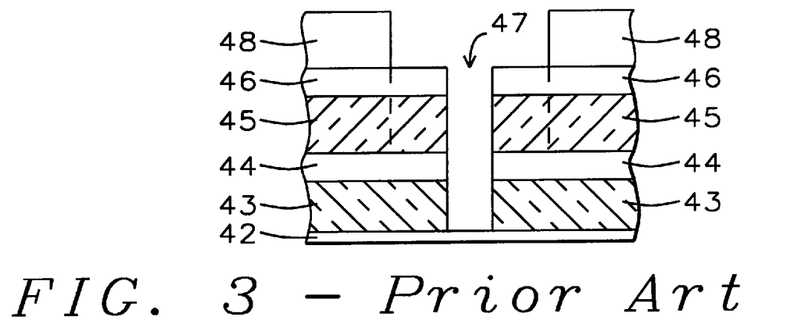
FIG. 3 shows the Prior Art deposition and patterning of a layer of photoresist for the creation of the trench of the dual damascene structure.

FIGS. 2 and 3 show a Prior Art sequence of steps the are used to create a dual damascene structure.

FIG. 2 shows a cross section of the opening 47 that has been created through the two layers of dielectric 43 and 45. Layer 42 is a stop layer that has been deposited prior to the formation of the first layer of dielectric 43. This layer 43 is typically deposited to a thickness of 1000 Angstrom and can contain SiON. Layer 42 is the etch stop layer for etching the opening 47. Over layer 43 of dielectric a second stop layer 44 is deposited, also typically to a thickness of about 1000 Angstrom while this layer also can contain SiON. This stop layer 44 serves as the stop for the etching of the interconnect line pattern that forms the top section of the profile of the dual damascene structure. A second layer 45 of dielectric is deposited over the second stop layer 44. A final layer 46 is deposited over the surface of the second dielectric 45, this layer can contain SiON and serves as a stress relieve layer over the dielectric layer 45. The lower section (roughly below the top surface of the second stop layer 44) of opening 47 forms the plug or via section of the dual damascene structure, the upper section (roughly above the top surface of the second stop layer 44) needs to be widened (etched) in order to form the trench or interconnect pattern of the dual damascene structure. The stop layers 42, 44 and 46 of SiON can be formed to a thickness of about 1700 angstrom through a CMP method employing silane as a silicon source material and ammonia as a nitrogen source material.

FIG. 3, shows how, before the etch for the trench of the dual damascene structure takes place, photoresist layer 48 has been deposited and patterned. Layer 48 of photoresist is typically deposited to a thickness of about 8000 Angstrom and forms a positive photoresist material and is deposited over the surface of layer 46 and patterned to created the trench profile of the dual damascene structure. The second layer of dielectric 45 can now be etched.

Figure 4:
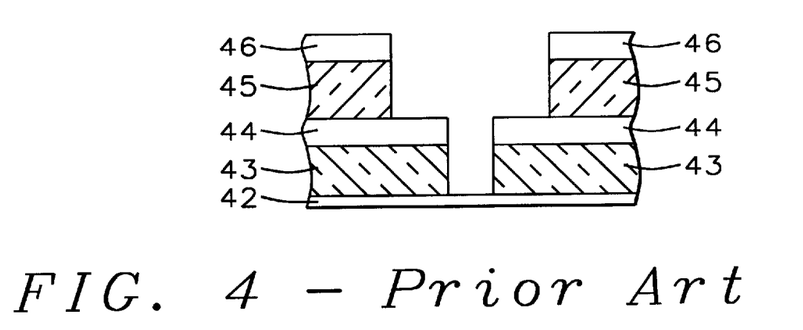
FIG. 4 shows a cross section of a Prior Art dual damascene structure that has been created using the successive layers of dielectric and stop layers of FIG. 2.

FIG. 4 shows a cross section after the latter etch has been completed. Critical dimension control of the dual damascene profile requires that all angles of corners and contours of the dual damascene are 90-degree angles.

U.S. Pat. No. 5,933,762 (Dai et al.), U.S. Pat. No. 5,877,075 (Dai et al.) and U.S. Pat. No. 5,882,996 (Dai) show dual damascene processes using a middle etch stop layer. This is close to the 3rd embodiment.

U.S. Pat. No. 5,933,761 (Lee) shows dual damascene processes similar to the 3rd embodiment using I/I processes. However, this reference differs from the invention.

U.S. Pat. No. 5,741,626 (Jain et al.) shows a dual damascene process with etch stop layers.

U.S. Pat. No. 5,635,423 (Huang et al.) recites a (1) trench etch and (2) via etch. This appears to show the 1st embodiment, see FIGS. 6A to 6C.

U.S. Pat. No. 5,868,354 (Avanzino et al.) teaches a dual damascene process with the (1) trench etch and (2) via etch. This is very close to the first embodiment.

U.S. Pat. No. 5,904,565 (Ngyen et al.), U.S. Pat. No. 5,801,094 (Yew et al.), and U.S. Pat. No. 5,863,835 (Yoo et al.) show other dual damascene processes.

SUMMARY OF THE INVENTION

A principle objective of the invention is to provide a method of creating a dual damascene structure using a tri-layer resist method.

In accordance with the objectives of the invention a new method is provided for the creation of a dual damascene structure. The methods of the invention can be divided into two embodiments of the invention.

Under the first embodiment of the invention, the trench is etched first after which the via is etched. A composite layer of photoresist is deposited over a semiconductor surface whereby the thickness of the composite layer is sufficient for the trench and the via etch. The composite layer of photoresist comprises a first layer of positive resist over which a second layer of imageable negative organic BARC (IOBARC) or a negative dyed resist is deposited over which a third layer of negative resist is deposited. The effect of the three layers of resist is that, during exposure for the etch trench, the second layer of negative resist/IOBARC serves as a pad layer that helps to prevent the light from reaching the underlying positive layer thereby preventing the trench developer from attacking the exposed positive resist layer. The via mask is performed, completing the formation of the dual damascene profile. The created dual damascene profile is transferred into the underlying substrate by ion etch processing. The removal of the layer of photoresist remaining after the via etch completes the formation of the dual damascene structure.

Under the second embodiment of the invention, the trench is etched first after which the via is etched. A composite layer of photoresist is deposited over a semiconductor surface whereby the thickness of the composite layer is sufficient for the trench and the via etch process. The composite layer of insulation comprises a first layer of organic BARC over which a second layer of negative resist is deposited. A wire or trench pattern is exposed on the negative resist. During development and exposure of the negative resist and the layer of BARC, the trench is defined while the remaining negative resist is cross linked thereby preventing further photo induced development. A layer of positive photoresist is deposited over the second layer of cross-linked negative resist and masked for the via pattern. The via development is performed, completing the creation of the dual damascene profile. The created dual damascene profile is transferred into the underlying substrate. The removal of the layers of patterned photoresist completes the formation of the dual damascene structure.

BRIEF DESCRIPTION OF THE DRAWINGS

FIGS. 1 and 2 address conventional formation of the dual damascene structure, as follows:

FIG. 5 shows cross-sections of a semiconductor surface on which the dual damascene structure is formed in accordance with the first embodiment of the invention, as follows:

FIG. 6 shows cross-sections of a semiconductor surface on which the dual damascene structure is formed in accordance with the second embodiment of the invention, as follows:

DESCRIPTION OF THE PREFERRED EMBODIMENTS

Figure 5A:
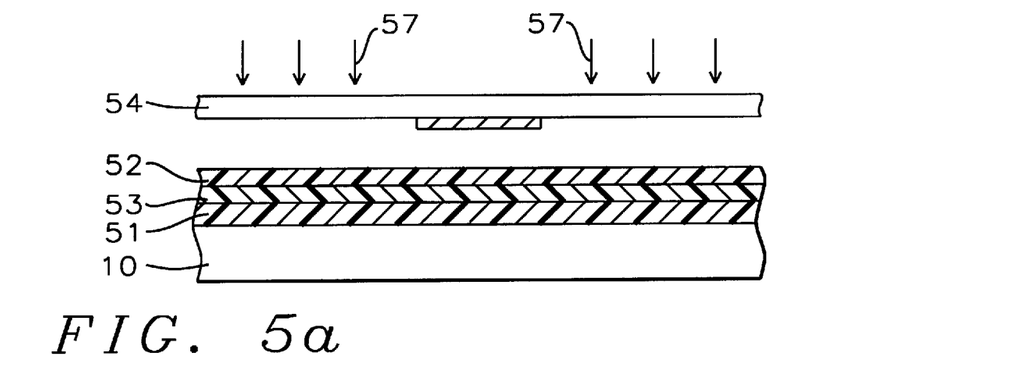
FIG. 5a shows a cross section of a semiconductor surface over which a first layer of positive resist and a second layer of imageable positive organic BARC or negative dyed resist and a third layer of negative resist have been deposited, the surface of the third layer of negative resist is being masked for a trench etch

Referring now specifically to FIG. 5a, there is shown a cross section of a semiconductor surface 10 over which a composite layer of photoresist has been deposited. The composite layer of photoresist that has been deposited contains a first layer 51 of positive photoresist over which a second layer 53 of imageable negative BARC or negative dyed photoresist and a third layer 52 of negative photoresist have been deposited. The three layers 51, 53 and 52 form a composite resist layer. The thin negative BARC or negative dyed photoresist layer 53 functions to prevent the light 57 from reaching the underlying positive tone resist layer 51 during the time that the negative resist 52 is exposed for the trench development. This action by the layer 53 of negative dyed resist minimizes the possibility that the developer will attack the positive resist layer 51 during the masking and exposure for the trench etch. The function that is in this manner performed by the interstitial layer 53 is the function of an Anti Reflective Coating (ARC). It is preferred that the first layer 51 of photoresist is positive resist, deposited to a thickness between about 0.4 and 0.9 um. It is preferred that the second layer 53 is an imageable negative organic ARC or a negative dyed resist, the preferred thickness of layer 53 of photoresist is between about 0.5 and 1.0 um. It is preferred that the third layer 52 is a negative resist, the preferred thickness of layer 52 of negative photoresist is between about 1.0 um and 2.5 um.

Figure 5B:
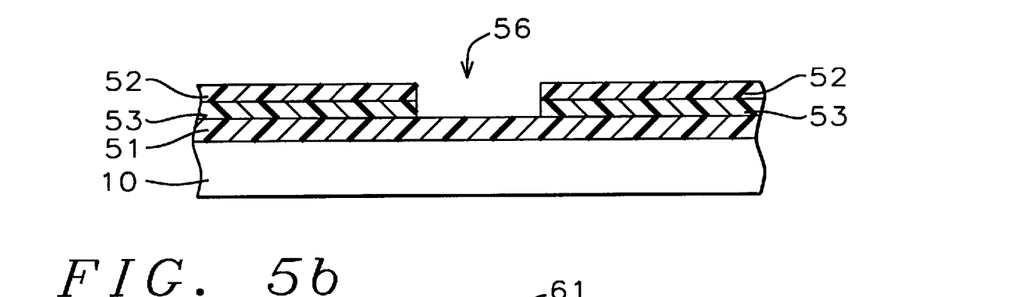
FIG. 5b shows a cross section after the trench has been etched into the third layer of negative photoresist and the second layer of imageable positive organic BARC or negative dyed resist

Next, the layer 52 of negative resist is exposed through a negative tone mask 54 having a hole pattern as shown in FIG. 5a. As is well known in the art, the field or background areas are opaque. Therefore, the light exposes only those areas on the layer of n-type resist that correspond to the inverse of the trench pattern in mask 54 and reacts with the base resin in the resist to form inverse trench regions that are soluble in a photoresist developing solution. The trench opening 56 that is shown in FIG. 5b is then formed, this trench opening penetrates both the second layer 53 of negative dyed resist and the third layer 52 of negative resist down to essentially the surface of the first layer 51 of positive resist.

In accordance with a key aspect of the invention, the trench pattern 56 is next hard-baked at a temperature between about 110 and 130 degrees C. for between about 30 and 120 seconds. This hard-bake is performed in order to cross-link the positive resist 52 that was exposed to light 57 that was not stopped by the opaque portion of the negative tone mask 54 of FIG. 5a. As will be seen shortly, this is a critical step in the process in that the n-type layer with the trench opening in it is now "hardened" and will therefore further protect the underlying positive resist to assure that the underlying layer 51 of positive resist is not be affected when this layer is developed for the via opening.

As is known in the art, positive and negative photoresist are at times referred to as being of opposite polarity. A positive or clear-field mask is used to expose the p-type layer through the mask that has the via pattern. Only via regions are exposed to energy levels between about 10 and 80 milijoules per $cm^2$ ($mj/cm^2$).

Figure 5C:
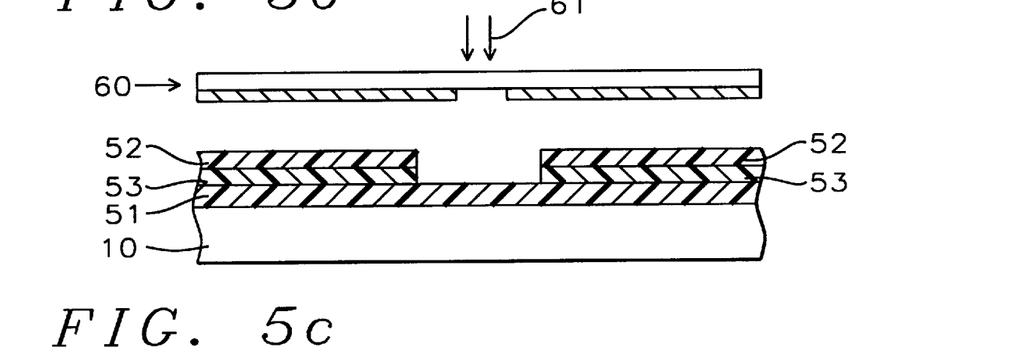
FIG. 5c shows a cross section after the via mask has been put in place and the first layer of positive resist is being exposed for the via opening

FIG. 5c shows the exposure 61 with the via mask 60 in place, this exposure to light source 61 exposes the first layer 51 of positive resist for the via opening. The exposed regions form a via pattern as shown in FIG. 5c, when layer 51 is developed only the exposed via pattern is removed.

Figure 5D:
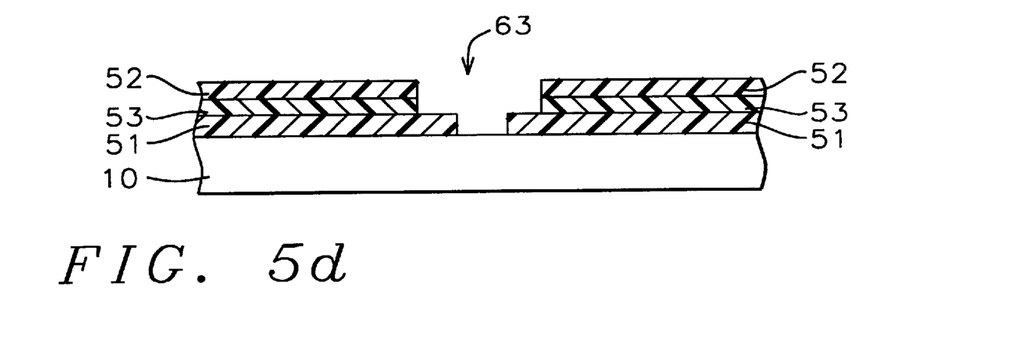
FIG. 5d shows a cross section after development of the via in the first layer of positive resist has been completed thereby completing the creation of the dual damascene profile in the composite layer of photoresist

FIG. 5d shows a cross section after the via pattern has been created in the first layer 51 of positive photoresist. Since the layer 51 of photoresist is a positive chemical amplification photoresist (CAR), the removal of portions of this first layer of positive photoresist can be accomplished with a recipe containing 2.38% TMAH developer stream, puddled for about 45 to 70 seconds. The creation of the via pattern in the first layer 51 of positive photoresist completes the creation of the dual damascene profile 63 that is shown in cross section in FIG. 5d.

It is clear from the cross section of the structure that has been formed in the composite layer of photoresist (as shown in FIG. 5d), that the profile of the opening that has been created in this composite layer 51/53/52 is the profile of a dual damascene structure. Conventional methods of RIE or ion milling can now transfer this profile into the underlying substrate 10, creating the dual damascene structure 67 in the surface of the substrate 10 as shown in cross section in FIG. 5e. The composite layer of photoresist must then be removed from the surface of the substrate. Conventional methods of photoresist stripping can be applied to this purpose, for instance using sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with de-ionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 5E:
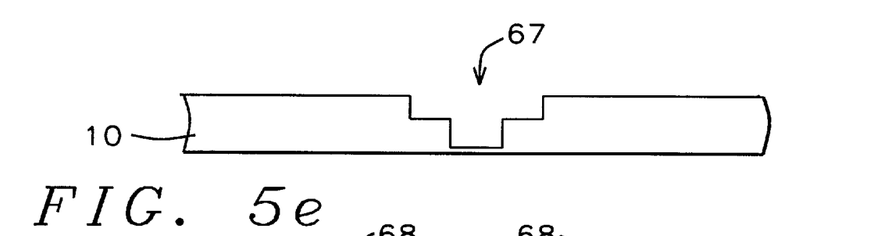
FIG. 5e shows a cross section after the transfer of the dual damascene profile has been transferred to the underlying substrate

The opening of the dual damascene structure that has been formed in the surface of the substrate can now be filled with metal. Polishing the surface of the deposited layer of metal down to the surface of the substrate completes the formation of the dual damascene metal interconnnect.

FIG. 6 addresses the second embodiment of the invention.

Special processing conditions and technical considerations that have been highlighted above and that also apply to the process of the second body of the invention will not be repeated under the discussion of the second embodiment of the invention.

Figure 6A:
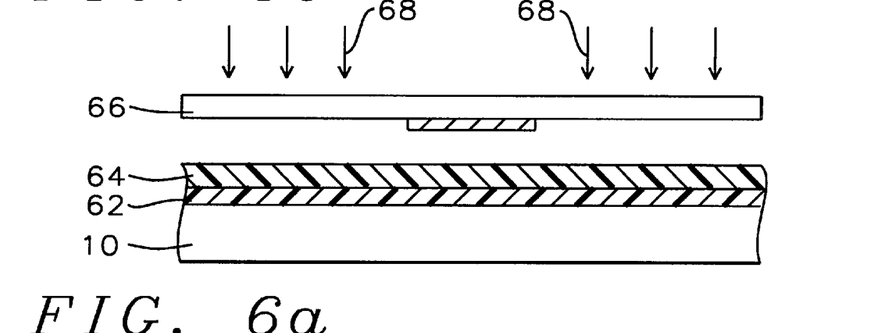
FIG. 6a shows a cross section of a semiconductor surface over which a first layer of organic BARC and a second layer of negative resist have been deposited, the second layer of negative photoresist is being patterned for the trench etch

FIG. 6a shows a cross section of a semiconductor surface, 10, that is typically the surface of a substrate, over which a first layer 62 of imageable negative organic BARC or negative dyed resist has been deposited, a second layer 64 of negative resist has been deposited over the surface of layer 62. FIG. 6a shows how, as under the first embodiment of the invention, the surface of the second layer 64, in this case the layer 64 of organic BARC, is exposed using a negative type tone mask 66. The mask 66 contains the pattern of the trench for the dual damascene structure. The combined thickness of layers 62 and 64 equals the height of the combined via and trench openings of the dual damascene structure.

Figure 6B:
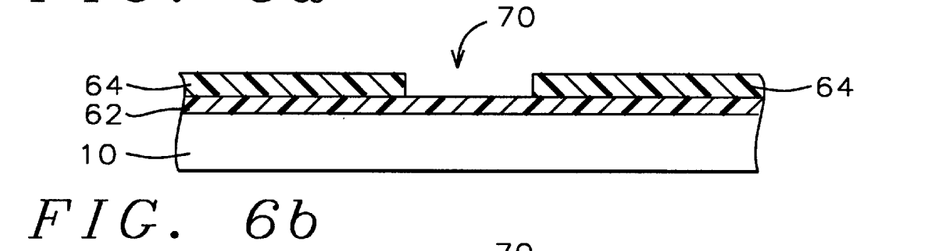
FIG. 6b shows a cross section after the trench development has been completed

Exposure 68 (FIG. 6a) exposes the trench pattern 70 in the surface of layer 64, FIG. 6b shows a cross section after the trench pattern has been etched. A hard-bake is applied to the layer 64 thereby cross-linking the negative resist.

Figure 6C:
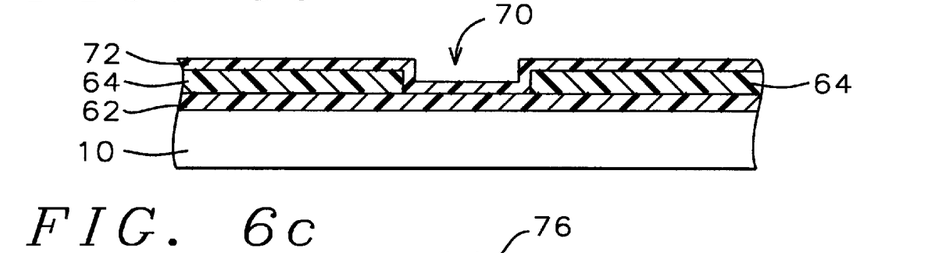
FIG. 6c shows a cross section after a layer of positive resist has been deposited
Figure 6D:
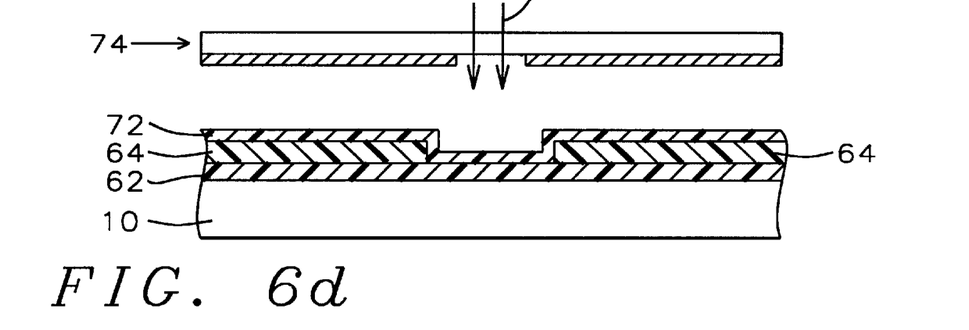
FIG. 6d shows a cross section of the patterning of the deposited layer of positive resist for the via creation

FIG. 6c shows how a layer 72 of positive resist is now deposited over the surface of the second layer 64 of negative resist including the trench opening that has been created.

Figure 6E:
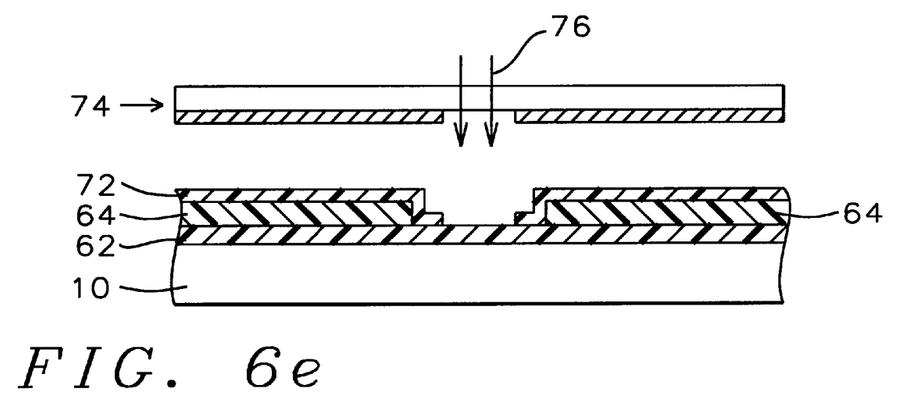
FIG. 6e shows a cross section after the via development has been completed

Layer 72 is exposed (exposure 76, FIG. 6d) for the via pattern using mask 74 after which the via pattern is developed, FIG. 6e.

With the completion of the creation of the via pattern as shown in cross section in FIG. 6e, the profile 78 for the dual damascene structure has been created. This dual damascene pattern 78, FIG. 6e, can be transferred into the underlying substrate by RIE or milling.

Figure 6F:
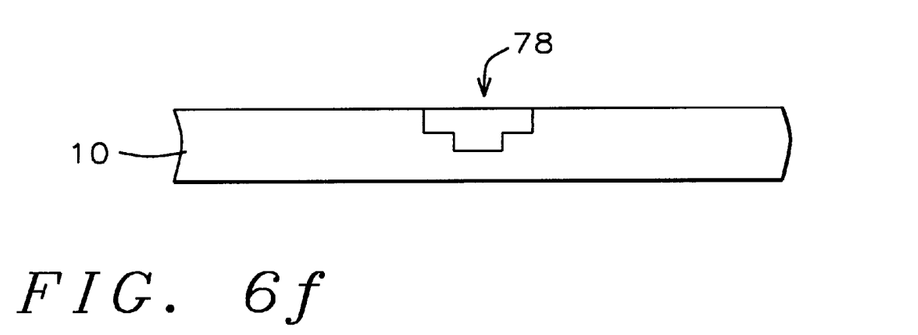
FIG. 6f shows a cross section that indicates the transfer of the photoresist profile to the substrate by the etch process.

FIG. 6f shows a cross section after the profile 78 of the dual damascene structure has been transferred into the underlying surface of substrate 10. The layers 62 and 64 are stripped from the surface of the substrate (not shown) after the opening of the dual damascene structure that has been formed in the surface of the substrate can now be filled with metal. Polishing the surface of the deposited layer of metal down to the surface of the substrate completes the formation of the dual damascene metal interconnect.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a dual damascene pattern employing a one step coating of multi-layer photoresist for both trench and via pattern, a one step photoresist stripping step and a one step post etch cleaning step, comprising the steps of:

providing a semiconductor substrate having a composite layer of insulation deposited thereon whereby said composite layer of insulation comprises a first layer of photoresist separated form a third layer of photoresist by an intervening intermediate second layer of photoresist;

trench patterning said third layer of photoresist by exposing said third layer of photoresist through a first mask;

performing development to remove portions of said third layer of photoresist to form a trench pattern in said third layer of photoresist whereby said trench pattern extends through said second layer of photoresist;

cross-linking said third layer of photoresist;

via patterning said first layer of photoresist by exposing said layer of photoresist through a second mask;

performing development to remove portions of said first layer of positive photoresist to form a via pattern in said first layer of photoresist whereby said via pattern extends through said first layer of positive photoresist thereby creating a dual damascene profile that is surrounded by said composite layer of insulation;

transferring said dual damascene profile into the surface of said substrate; and removing said thick layer of photoresist.

2. The method of claim 1 wherein said first layer of photoresist is a positive chemical amplification photoresist (CAR) deposited to a thickness between about 0.4 and 0.9 um.

3. The method of claim 1 wherein said intervening intermediate second layer of photoresist is imageable negative BARC or negative dyed photoresist deposited to a thickness between about 0.5 and 1.0 um.

4. The method of claim 1 wherein said third layer of photoresist is a negative layer of photoresist deposited to a thickness of between about 1.0 um and 2.5 um.

5. The method of claim 1 wherein said intervening intermediate second layer of photoresist serves the function of an interstitial Anti-Reflective Coating (ARC).

6. The method of claim 1 wherein said second layer of photoresist is water soluble.

7. The method of claim 1 wherein said second layer of photoresist has a refractive index between about 1.0 and 3.0.

8. The method of claim 1 wherein said third layer of photoresist is planarized using chemical mechanical polishing techniques.

9. The method of claim 1 wherein said first mask has negative resist trench patterns with clear field reticle.

10. The method of claim 1 wherein said second mask has positive resist trench patterns with dark field reticle.

11. The method of claim 1 wherein said transferring said dual damascene profile into the surface of said substrate uses RIE or ion milling techniques.

12. The method of claim 1 wherein said performing development to remove portions of said first layer of positive photoresist is accomplished with a recipe containing 2.38% TMAH developer stream puddled for about 45 to 70 seconds.

13. The method of claim 1 wherein said cross linking said second layer of photoresist is a hard-bake at a temperature between about 110 and 130 degrees C. for between about 30 and 120 seconds.

14. The method of claim 1 with the additional steps of depositing a layer of metal over said dual damascene profile that has been transferred into the surface of said substrate followed by polishing the surface of said deposited layer of metal down to the surface of said substrate thereby completing the formation of a metal filled dual damascene structure.

15. A method of forming a dual damascene pattern employing a one step coating of multi-layer photoresist for both trench and via pattern, a one step photoresist stripping step and a one step post etch cleaning step, comprising the steps of:

providing a semiconductor substrate having a composite layer of insulation deposited thereon whereby said composite layer of insulation comprises a first layer of photoresist over which a second layer of photoresist has been deposited;

trench patterning said second layer of photoresist by exposing said second layer of photoresist through a first mask;

performing development to remove portions of said second layer of photoresist to form a trench pattern in said second layer of photoresist whereby said trench pattern extends through said second layer of photoresist;

cross-linking said second layer of photoresist;

depositing a third layer of photoresist over the surface of said second layer of negative cross linked photoresist thereby including said trench pattern;

via patterning said third layer of positive photoresist by exposing said third layer of photoresist through a second mask;

performing development to remove portions of said third layer of positive photoresist to form a via pattern in said third layer of positive photoresist whereby said via pattern extends through said third layer of positive photoresist and said second layer of photoresist thereby creating a dual damascene profile that is surrounded by said composite layer of insulation;

transferring said dual damascene profile into the surface of said substrate; and removing said layers of photoresist.

16. The method of claim 15 wherein said first layer of photoresist is imageable negative BARC or negative dyed photoresist deposited to a thickness between about 0.5 and 1.0 um.

17. The method of claim 15 wherein said second layer of photoresist is a negative chemical amplification photoresist (CAR) deposited to a thickness between about 0.4 and 0.9 um.

18. The method of claim 15 wherein said third layer of photoresist is a positive layer of photoresist deposited to a thickness of between about 0.4 and 0.9 um.

19. The method of claim 15 wherein said second layer of photoresist serves the function of an interstitial Anti-Reflective Coating (ARC).

20. The method of claim 15 wherein said second layer of photoresist is water-soluble.

21. The method of claim 15 wherein said second layer of photoresist has a refractive index between about 1.0 and 3.0.

22. The method of claim 15 wherein said third layer of photoresist is planarized using chemical mechanical polishing techniques.

23. The method of claim 15 wherein said first mask has negative resist trench patterns with clear field reticle.

24. The method of claim 15 wherein said second mask has positive resist trench patterns with dark field reticle.

25. The method of claim 15 wherein said transferring said dual damascene profile into the surface of said substrate uses RIE or ion milling techniques.

26. The method of claim 15 wherein said performing development to remove portions of said first layer of positive photoresist is accomplished with a recipe containing 2.38% TMAH developer stream puddled for about 45 to 70 seconds.

27. The method of claim 15 wherein said cross linking said second layer of photoresist is a hard-bake at a temperature between about 110 and 130 degrees C. for between about 30 and 120 seconds.

28. The method of claim 15 with the additional steps of depositing a layer of metal over said dual damascene profile that has been transferred into the surface of said substrate followed by polishing the surface of said deposited layer of metal down to the surface of said substrate thereby completing the formation of a metal filled dual damascene structure.

* * * * *